(12) United States Patent
Hoshino

(10) Patent No.: US 7,887,278 B2
(45) Date of Patent: *Feb. 15, 2011

(54) OVERHEAD TRAVELLING CARRIAGE SYSTEM

(75) Inventor: Kenji Hoshino, Nagoya (JP)

(73) Assignee: Murata Kikai Kabushiki Kaisha, Kyoto-shi (JP)

( * ) Notice: Subject to any disclaimer, the term of this patent is extended or adjusted under 35 U.S.C. 154(b) by 569 days.

This patent is subject to a terminal disclaimer.

(21) Appl. No.: 11/199,390

(22) Filed: Aug. 9, 2005

(65) Prior Publication Data

US 2006/0051188 A1    Mar. 9, 2006

(30) Foreign Application Priority Data

Aug. 12, 2004    (JP)    .............................. 2004-235192

(51) Int. Cl.
B65G 1/133    (2006.01)
(52) U.S. Cl. .................................. 414/217.1; 414/940
(58) Field of Classification Search .................. 414/940, 414/217.1
See application file for complete search history.

(56) References Cited

U.S. PATENT DOCUMENTS

| | | | |
|---|---|---|---|
| 5,584,118 A | | 12/1996 | Furukawa et al. |
| 5,980,183 A | * | 11/1999 | Fosnight ................ 414/222.01 |
| 6,379,096 B1 | * | 4/2002 | Beutler et al. ................ 414/281 |
| 6,450,318 B1 | * | 9/2002 | Minardi .................... 198/346.3 |
| 6,579,052 B1 | * | 6/2003 | Bonora et al. .......... 414/222.01 |
| 6,604,624 B2 | * | 8/2003 | Hirata et al. ................. 198/494 |
| 6,746,197 B2 | * | 6/2004 | Kimura et al. .............. 414/217 |
| 6,769,584 B2 | * | 8/2004 | Adams et al. ................ 224/518 |
| 6,851,913 B2 | * | 2/2005 | Iizuka ......................... 414/626 |
| 6,877,944 B2 | * | 4/2005 | Peiter ......................... 414/279 |
| 6,990,721 B2 | * | 1/2006 | Mariano et al. ................ 29/469 |
| 7,165,927 B2 | * | 1/2007 | Doherty et al. ........ 414/331.02 |
| 2002/0033319 A1 | | 3/2002 | Fukushima |
| 2003/0168313 A1 | | 9/2003 | Hiroki |
| 2003/0190223 A1 | * | 10/2003 | Peiter .......................... 414/542 |
| 2004/0109746 A1 | * | 6/2004 | Suzuki ........................ 414/373 |

(Continued)

FOREIGN PATENT DOCUMENTS

JP    04-085162 A    3/1992

(Continued)

OTHER PUBLICATIONS

European Search Report dated Jan. 19, 2007, issued in corresponding European Patent Application No. 05014708.1.

(Continued)

Primary Examiner—Saúl J Rodríguez
Assistant Examiner—Joshua I Rudawitz
(74) Attorney, Agent, or Firm—Westerman, Hattori, Daniels & Adrian, LLP

(57) ABSTRACT

An article is conveyed from a load port 26a for a processing device 16 to a load port 26b for a processing device 20. An overhead buffer 28 is provided for each load port 26. An overhead travelling carriage 14 can freely deliver the article to the load port 26 or to the overhead buffer 28. The article can be conveyed directly between processing devices for different processes via inter-bay routes 6, 7. Only a short time is required for conveyance. It is unnecessary to provide stockers between the intra-bay routes 6, 7 and the inter-bay route 8.

12 Claims, 9 Drawing Sheets

U.S. PATENT DOCUMENTS

2004/0149672 A1* 8/2004 Motoori et al. ............. 212/332
2004/0265107 A1* 12/2004 Kim et al. ................... 414/626

FOREIGN PATENT DOCUMENTS

| JP | 10-045213 A | 2/1998 |
|---|---|---|
| JP | 11-180505 A | 7/1999 |
| JP | 2002-96725 | 4/2002 |
| JP | 2002-096725 A | 4/2002 |
| JP | 2004-189018 A | 7/2004 |

OTHER PUBLICATIONS

Notification of Reason(s) for Refusal dated Aug. 25, 2008 of the Japanese Patent Application No. 2004-235192, from the Japanese Patent Office.

* cited by examiner

OVERHEAD TRAVELLING CARRIAGE SYSTEM

FIELD OF THE INVENTION

The present invention relates to an overhead travelling carriage system, and in particular, to direct conveyance of articles between different processes.

BACKGROUND ART

In an overhead travelling carriage system, articles are conveyed by allowing an overhead travelling carriage to run using a running rail installed near a ceiling of a clean room or the like. In a large-scale system, the route is divided into conveying routes in a process (intra-bay routes) and conveying routes between processes (inter-bay routes). A plurality of intra-bay routes are connected to one inter-bay route. In a normal system, a stocker is placed between each intra-bay route and the inter-bay route. Thus, a conveying operation is divided into a part from a processing device to the corresponding stocker, a part from the stocker through the inter-bay route to a stocker located at the boundary between the inter-bay route and the intra-bay route to a destination, and a part from this stocker to a load port for the processing device at the destination. This requires a large number of stockers, and temporary storage of articles in the stocker is repeated before the travelling carriage reaches the destination. Consequently, the conveyance requires a long time. In connection with this, the Japanese Patent No. 3508130 proposes that a processing device facing one of the intra-bay routes conveys an article directly to a processing device facing the other intra-bay route. However, the conveyance is restricted by the possibility that the load port at the destination is occupied. For example, if the load port at the destination is being used and the conveyance of the article is assigned to an available overhead travelling carriage, it is difficult to predict whether or not the load port will be free before the overhead travelling carriage arrives. If the load port is unavailable for a long time, the conveyance of the article is delayed.

SUMMARY OF THE INVENTION

It is an object of the present invention to provide an overhead travelling carriage system that enables inter-bay conveyance in a short time substantially without being restricted by the possibility that a load port at a destination is unavailable, the system making it possible to eliminate the need for stockers used for the transfer between an intra-bay route and an inter-bay route.

It is an additional object of the present invention set for the in claim 2 to enable articles to be transferred between an overhead buffer and a load port using an overhead travelling carriage without the need for a conveyor or the like for the overhead buffer.

It is an additional object of the present invention set for the in claim 3 to facilitate the transfer of articles between the load port and the overhead buffer and to allow a mechanism for controlling stoppage at the load port to be also used to control stoppage at the overhead buffer.

The present invention provides an overhead travelling carriage system in which an overhead travelling carriage runs from a first intra-bay route through inter-bay route to a second intra-bay route to convey an article between load ports for processing devices provided below an intra-bay running rail, the intra-bay routes and inter-bay route each including a running rail, the overhead travelling carriage system being characterized in that overhead buffers are provided on one side of the running rail and the overhead travelling carriage is provided with delivery means for delivering the article to the overhead buffer.

The processing device is interpreted in a broader sense and includes not only a device that processes articles to be conveyed (processing device in a narrow sense) but also a device that inspects articles.

Further, the overhead buffer means a buffer located near the ceiling of a building such as a clean room and does not necessarily mean a buffer supported on the ceiling.

Preferably, the delivery means moves a platform between each of the load ports and the corresponding overhead buffer. The delivery means is preferably composed of means for moving the platform to one side of the running rail, and means for elevating and lowering the platform.

Further, preferably, each of the overhead buffers is placed at almost the same position as that of the corresponding load port in a running direction of the running rail.

With the overhead travelling carriage system according to the present invention, an article can be conveyed directly from the processing device facing the first intra-bay route through the inter-bay route to the processing device facing the second intra-bay route. If the load port at the destination is occupied, the article may be temporarily placed in a nearby overhead buffer. This makes it possible to substantially avoid the situation in which the article cannot be transferred because the load port at the destination is occupied. Further, when the conveying operation is to be assigned to any of the overhead travelling carriages, the assignment can be accomplished provided that there is any available overhead travelling carriage because the article can be substantially reliably delivered to the load port or overhead buffer at the destination. Moreover, the processing device at the destination can temporarily place an article to be conveyed, on the overhead buffer, thus preventing the load port from being occupied. Further, the order of conveyance can be changed by conveying the article at the load port before the article on the overhead buffer. Furthermore, the present invention makes it possible to eliminate the need to provide a stocker at the boundary between the intra-bay route and the inter-bay route.

According to the aspect of the present invention set for the in claim 2, the delivery means of the overhead travelling carriage enables the article to be transferred between the overhead buffer and the load port. This eliminates the need to provide the overhead buffer with a conveyor or the like which is used to transfer the article between the overhead buffer and the load port.

According to the aspect of the present invention set for the in claim 3, the overhead buffer is placed at almost the same position as that of the load port along the running direction of the running rail. For example, the overhead buffer lies opposite the load port. Thus, dogs (marks) used to control the stoppage of the overhead travelling carriage at the load port can also be used control the stoppage of the overhead travelling carriage at the overhead buffer. This facilitates an operation of attaching the dogs to the running rail or the like. Further, the overhead travelling carriage need not be run in transferring the article between the overhead buffer and the load port, or if it is run at all, the running distance is short. This facilitates the transfer between the overhead buffer and the load port.

DETAILED DESCRIPTION OF THE PREFERRED EMBODIMENTS

An embodiment will be shown below which is optimum for carrying out the present invention.

Figure 1:
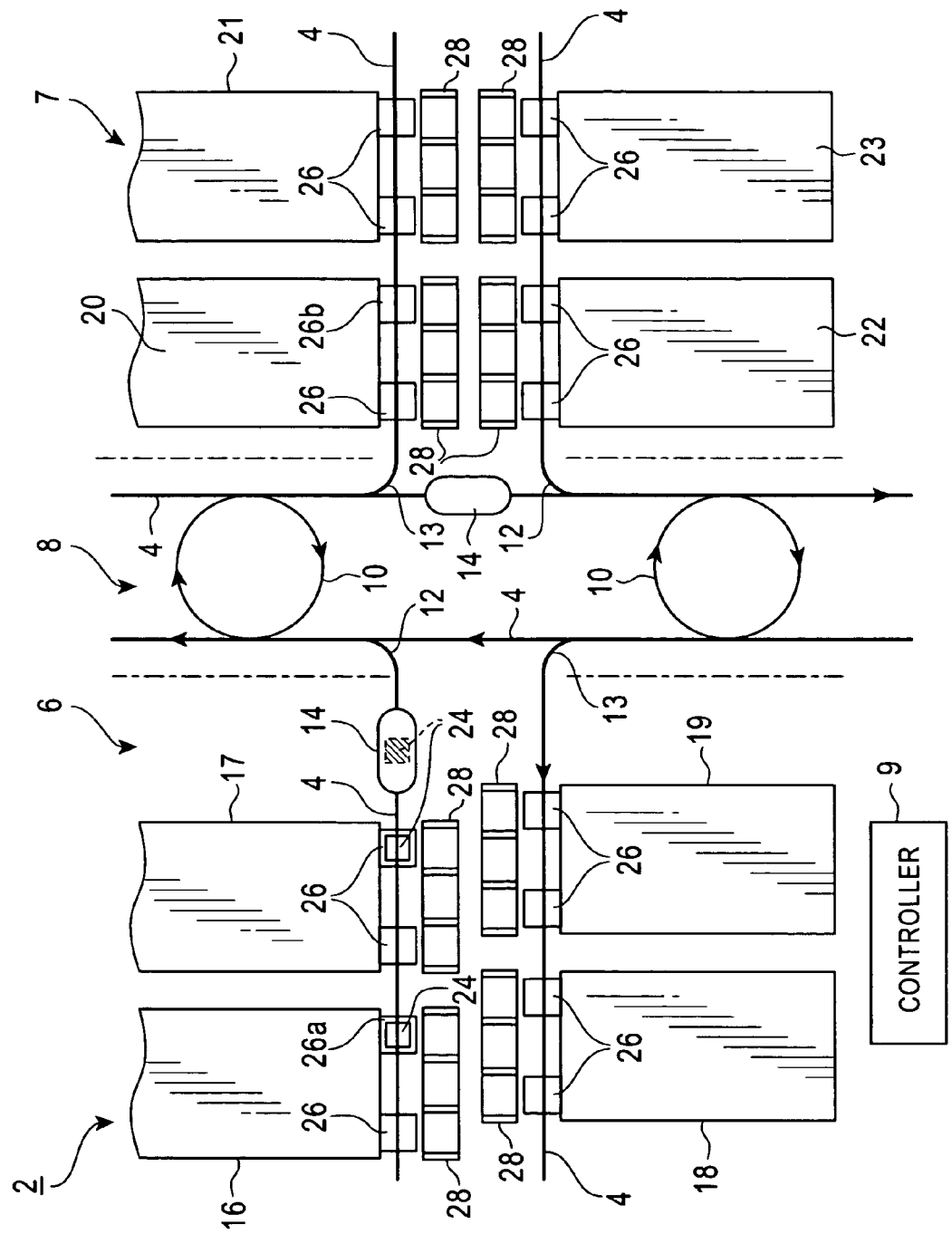
FIG. 1 is a plan view showing the layout of an overhead travelling carriage system according to an embodiment.

FIGS. 1 to 9 shows an embodiment and a variation. In the figures, 2 is an overhead travelling carriage system installed in a clean room or the like to convey semiconductor substrates, liquid crystal substrates, or the like within a process or between processes. 4 is a running rail divided into intra-bay routes 6, 7 for intra-bay conveyance and an inter-bay route 8 for inter-bay conveyance. An overhead travelling carriage can run on the running rail 4 in only one way. The inter-bay route 8 is provided with a short cut 10. The intra-bay routes 6, 7 are connected to the inter-bay route 8 by a joining portion 12 and a branching portion 13. FIG. 1 shows the two intra-bay routes 6, 7. However, actually, more intra-bay routes 6, 7 are connected to the inter-bay route 8. The intra-bay routes 6, 7 and the inter-bay route 8 may collectively be referred to as routes 6 to 8.

In accordance with instructions from a conveyance controller 9, for example, a plurality of overhead travelling carriages 14 runs along the routes 6 to 8 to convey articles, for example, in the form of cassettes 24 among processing devices 16 to 23 such as semiconductor or liquid crystal processing devices or their inspecting devices. One or more load ports 26 are provided for each of the processing devices 16 to 23 at respective positions below the running rail 4 to transfer the cassette 24. Further, an overhead buffer 28 is provided in association with the load ports 26, for example, at almost the same position as that of the corresponding load port 26 in the running direction of the running rail 4 and opposite the running rail 4 as viewed from the processing devices 16 to 23. The cassette 24 can be temporarily placed on the overhead buffer 28. The overhead buffer 28 is provided on one side of the running rail 4 and need not necessarily be installed opposite the processing devices 16 to 23. Preferably, the article can be transferred between each load port 26 and the corresponding overhead buffer 28 at the same position in the running direction of the running rail 4.

In FIG. 1, it is assumed that the cassette is conveyed from the load port 26a of the processing device 16, facing the intra-bay route 6, through the inter-bay route 8 to the load port 26b of the processing device 20, facing the intra-bay route 7. When the cassette is conveyed from the load port 26a directly to the load port 26b without providing the overhead buffer 28, if the load port 26b is unavailable for unloading, the overhead travelling carriage 14 having conveyed the cassette stands by while for example, circulating through the intra-bay route 7. Because of the long distance by which the article is conveyed from the intra-bay route 6 to the intra-bay route 7, it is difficult to predict the state in which the load port 26b is when the overhead travelling carriage 14 arrives. When the overhead travelling carriage 14 conveying a cassette arrives at the load port 26b, the port 26b may be unavailable for loading because for example, the arrival of the last cassette has been delayed.

In a conventional example, the direct conveyance from the load port 26a to the load port 26b is avoided in order to prevent a reduction in conveyance efficiency. Stockers (automatic warehouses; not shown in the drawings) are arranged in the joining portion 12 and branching portion 13 at the boundaries between the intra-bay route 6 and the inter-bay route 8. Likewise, stockers are arranged in the joining portion 12 and branching portion 13 at the boundaries between the inter-bay route 8 and the intra-bay route 7. The conveyance of a cassette is divided into three conveying operations, an operation from the load port 26a to the stocker at the outlet of the intra-bay route 6, an operation from this stocker to the stocker at the inlet of the intra-bay route 7, and an operation from this stocker to the load port 26b. When the load port 26b becomes available for unloading, the cassette is conveyed from the stocker at the inlet of the intra-bay route 7. However, this conventional example requires a large number of stockers and increases the time required for conveyance because one conveying operation is divided into a plurality of operations.

In the embodiment, the cassette can be conveyed from the load port 26a directly to the load port 26b, or if the load port 26b is occupied, can be conveyed to the opposite overhead buffer 28. There are few opportunities that both load port 26b and opposite overhead buffer are occupied. Accordingly, once the cassette is unloaded on the load port 26b, the overhead travelling carriage 14 may start conveying the cassette even if the load port 26b is occupied. The overhead travelling carriage 14 may then unload the cassette on the load port 26b or the opposite overhead buffer 28. If the overhead travelling carriage 14 unloads the cassette on the overhead buffer 28, the cassette is transferred from the overhead buffer 28 to the load port 26b when the load port 26b becomes available. The overhead buffer 28 lies at the same position as that of the corresponding load port 26 along the running rail 4. Accordingly, a free overhead travelling carriage 14 can be stopped at a position where it faces the overhead buffer 28 and load port 26 so that it can pick can pick up the cassette from the overhead buffer 28 and then deliver the cassette to the load port 26.

If no overhead travelling carriage 14 can be assigned to long-distance conveyance of the cassette at the source load port 26a, the following operation is performed in order to prevent the load port 26a from being occupied. When a free overhead travelling carriage 14 is running closer, the cassette is transferred from the load port 26a to the opposite overhead buffer. This makes it possible to prevent the load port 26a from being occupied until an overhead travelling carriage 14 arrives on which the cassette is to be conveyed. Further, the order of conveyance can be changed by temporarily placing a cassette scheduled to be conveyed earlier on the overhead buffer 28 to allow a cassette scheduled to be conveyed later to be transported earlier.

Figure 2:
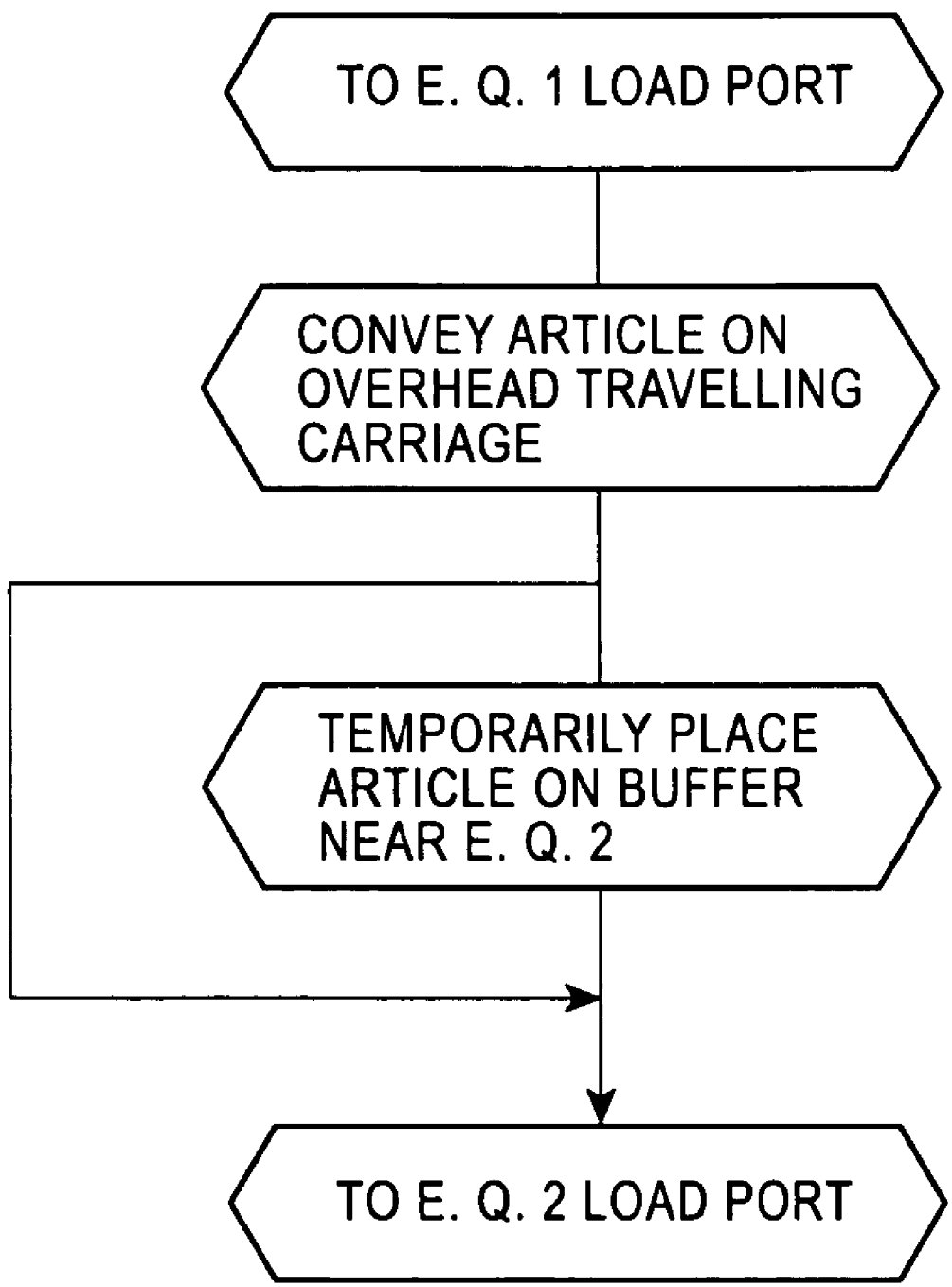
FIG. 2 is a diagram showing a procedure of conveyance from processing device to processing device in the overhead travelling carriage system according to the embodiment.
Figure 3:
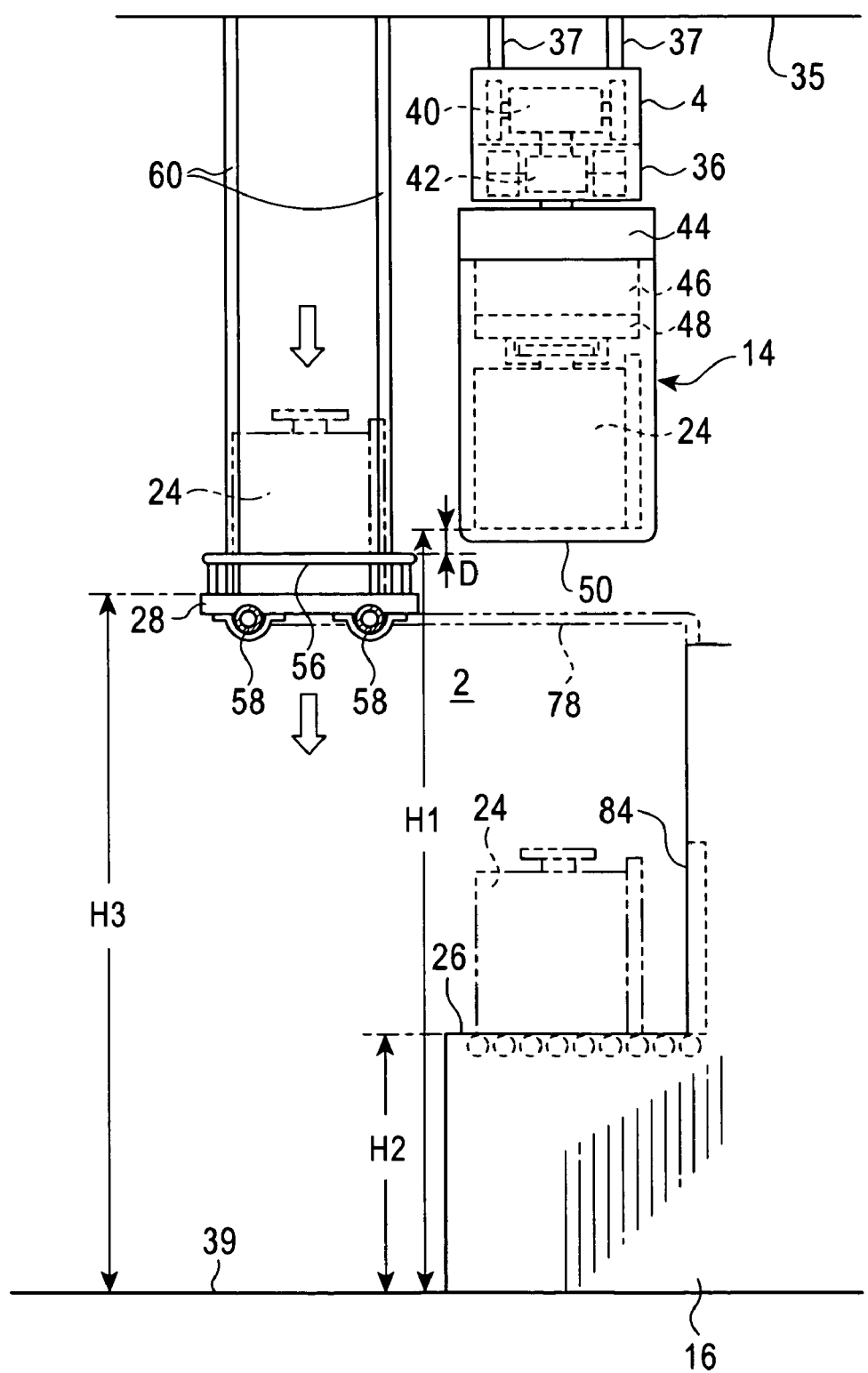
FIG. 3 is a front view showing an overhead travelling carriage and an overhead buffer in the overhead travelling carriage system according to the embodiment.

FIG. 2 shows a procedure of conveyance between bays according to the embodiment.

When the source processing device delivers a cassette to the load port, the overhead travelling carriage 14 conveys the cassette to the destination load port via the inter-bay route 8 or the like. If no overhead travelling carriages 14 can be assigned to the conveyance or the order of conveyance is to be changed, the cassette is temporarily placed in the source overhead buffer 28. If the destination load port is available for unloading, the arriving overhead travelling carriage 14 unloads the cassette directly on the load port. If the destination load port is unavailable for unloading, the cassette is temporarily placed on the overhead buffer 28 located at the same position as that of the destination load port with respect to the running rail 4. The overhead travelling carriage 14 used for this conveyance is assigned to the next conveying operation. Then, when the destination load port becomes available for unloading and a free overhead travelling carriage 14 is running closer, the cassette is transferred from the overhead buffer 28 to the load port.

With reference to FIGS. 3 to 8, a description will be given of the structure of the overhead travelling carriage 14 and the structure and mounting of the overhead buffer 28.

The running rail 4 is hung from a ceiling 35 using hanging bolts 37 or the like, and an electricity supplying rail 36 is integrally mounted at the bottom of the running rail 4. The overhead travelling carriage 14 comprises a running driving section 40 that runs through the running rail 4 and a non-contact electricity supplying section 42 to which electricity is fed through the electricity supplying rail 36 by, for example, non-contact electricity supplying. The following are arranged on the electricity supplying rail 36: a communication line for communications between the overhead travelling carriage 14 and a controller 9, and dogs used to control the stoppage of the overhead travelling carriage 14 at the load port 26. The non-contact electricity supplying section 42 is provided with a non-contact electricity supplying coil, a transmitting and receiving section that transmits and receives signals to and from the communication line to the controller, and a sensor used to detect the dogs.

Figure 4:
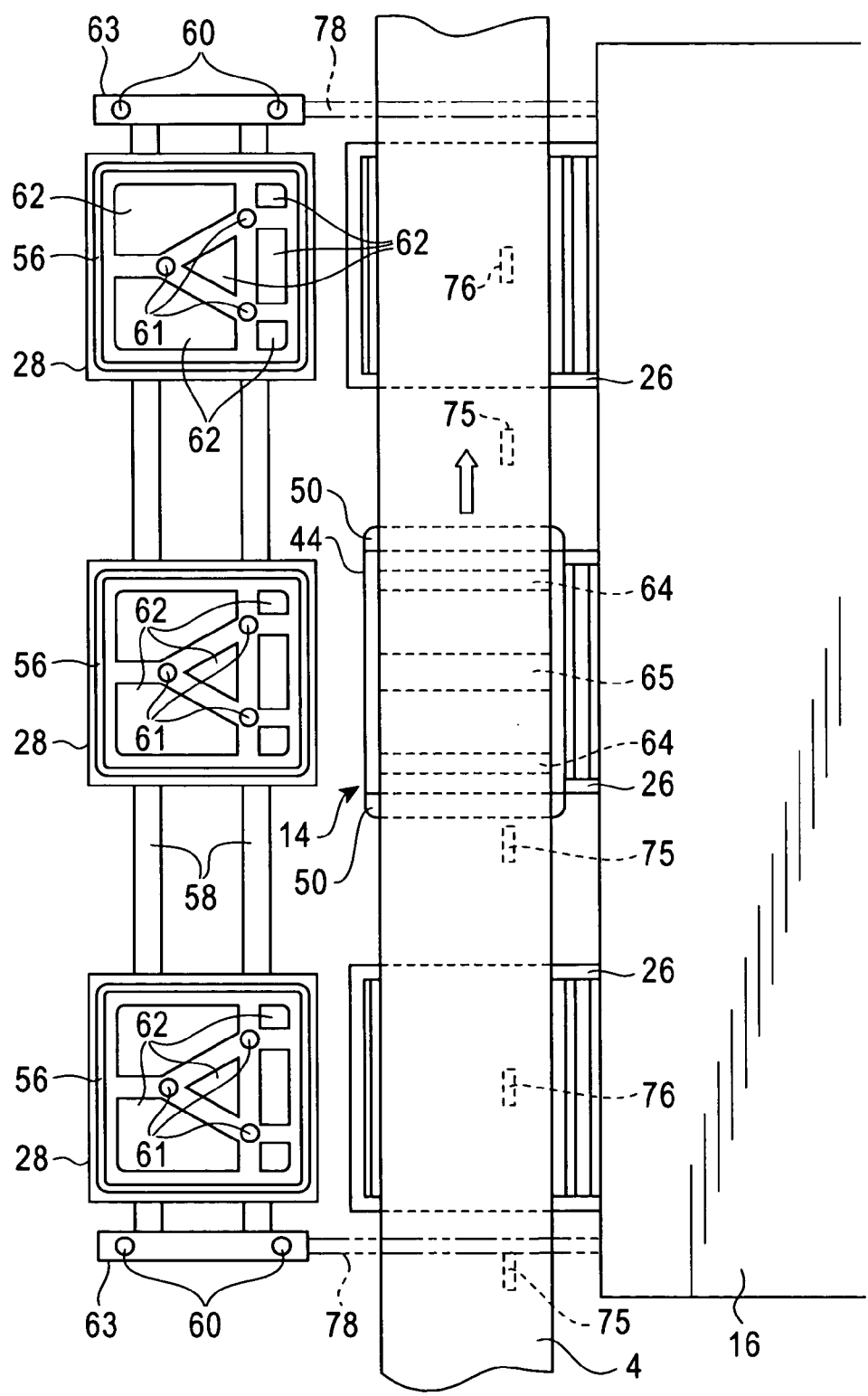
FIG. 4 is a plan view of an essential part of the overhead travelling carriage system according to the embodiment, showing a running rail for the overhead travelling carriage and the overhead buffer.

44 is a lateral feeding section that moves an elevation driving section 46 and a platform 48 to one side of the running rail 4. The elevation driving section 46 and the platform 48 may be moved to either side of the running rail 4, but in the embodiment, are moved only to the side (left side of FIG. 3) opposite to each of the processing devices 16 to 23. The lateral feeding section 44 moves the elevation driving section 46 and the platform 48 forward and backward with respect to one side of the running rail 4. The lateral feeding section 44 of the overhead travelling carriage 14, for example, guides the elevation driving section using a pair of linear guides 64 and moves it forward and backward with respect to the side of the running rail 4 using a lateral drive 65, as shown in FIG. 4. Fall preventing members 50 are provided, for example, in front of and behind the overhead travelling carriage 14 to prevent the cassette 24, an example of a conveyed article, from falling from a platform 48 owing to possible vibration during running. The cassette 24 accommodates semiconductor substrates or the like. The platform 48 chucks and supports a flange or the like which projects from the top surface of the cassette 24.

The overhead buffer 28 is provided on one side of the running rail 4, for example, opposite each of the processing devices 16 to 23. A fall preventing fence 56 is provided on the overhead buffer 28 to prevent the cassette 24 from falling. The figure shows that the fall preventing fence 56 is placed along the four sides of the overhead buffer 28 at the same height. However, for example, the fall preventing fence 56 may be lower on its side closer to the overhead travelling carriage 14 and may be higher on the opposite side. The overhead buffer 28 is supported using, for example, a pair of parallel pipe-like support members 58. End plates 33 or the like are provided at the opposite ends of each of the support members 58 so that the overhead buffer 28 can be hang from, for example, the ceiling 35 using hanging bolts 60 or the like. 61 is positioning pins provided on the overhead buffer 28 and fitted into concave portions formed in the bottom surface of the cassette 24 to position the cassette 24.

The fall preventing means are composed of the fall preventing fence 56 and the positioning pin 61. The fall preventing fence 56 projects upward from the overhead buffer 28 farther than the positioning pins 61. The height of a part of the fall preventing fence 56 which is closer to the overhead travelling carriage 14 corresponds to the height of top of the fall preventing means. If the fall preventing fence 56 is not provided, the height of the positioning pins 61 corresponds to the height of top of the fall preventing means. Openings 62 are formed in the overhead buffer 28 so as not to block the flow of clean air blown downward from the ceiling 35 to a floor surface 39. More preferably, the overhead buffer 28 is composed of transparent plastic to allow an operator to easily check whether or not the overhead buffer 28 contains a cassette 24.

The processing devices 16 to 23 are each provided with a load port 26 comprising a conveyor. 84 is an entrance through which the cassette 24 is unloaded and transferred to the interior of any of the processing devices 16 to 23 and in which the cassette 24 from the processing device 16 to 23 is placed for conveyance. In this case, the end plates 63 are hung from the ceiling 35 using the hanging bolts 60. However, the end plates 63 may be supported by each of the processing devices 16 to 23 using a strut 78 shown by a chain line.

The height of each part will be described below. The height H1 of the bottom surface of the cassette 24 on the running overhead travelling carriage 14 is, for example, about 2,500 to 3,000 mm. The height of the load port 26 is, for example, about 800 to 1,000 mm. Accordingly, an operator can load and unload the cassette 24 on and from the load port 26. The height H3 of the overhead buffer 28 is preferably is such that the overhead buffer 28 does not interfere with the operator; the height H3 is, for example, at least 2,000 mm. The difference D in height between the top of a surface of the fall preventing fence 56 which is closer to the overhead travelling carriage 14 and the bottom surface of the cassette 24 on the running overhead travelling carriage 14 is, for example, about 30 to 300 mm, in this case, 100 mm.

As shown in FIG. 4, the overhead buffer 28 is provided at the same position as that of the load port 26 in the running direction of the running rail 4 as viewed two-dimensionally. The load port 26 is located immediately below the running rail 4. The overhead buffer 28 is located opposite each of the processing devices 16 to 23 and above the load port 26 as viewed from the running rail 4. The load port 26 and the overhead buffer 28 are preferably provided along the running direction of the overhead travelling carriage 14 at the same position on the opposite sides of the running rail 4 as viewed two-dimensionally. The difference between the position of the load port 26 and the position of the overhead buffer 28 (the difference in position along the running direction of the overhead travelling carriage 14, which is called a shift) is preferably at most 300 mm. Dogs (marks used to control the overhead travelling carriage 14) are provided on the electricity supplying rail 36, located at the bottom of the running rail 4. A dog 75 is provided upstream of the load port 26 in the running direction to indicate that the overhead travelling carriage 14 is approaching a load port 26. A dog 76 is used to control the stoppage of the overhead travelling carriage 14. Only one of the two dogs 75, 76 may be provided. In the embodiment, the position of the overhead buffer 28 is the same as that of the load port 26 along the running direction of the running rail 4. When stopped at the load port 26, the overhead travelling carriage 14 can also be stopped at the correct position for the overhead buffer 28.

If the overhead buffer 28 cannot be installed at the same position as that of the load port 26 along the running direction of the overhead travelling carriage 14 for any reasons of mounting, it may be shifted along the running direction of the overhead travelling carriage 14 by about 5 to 30 cm, for example, forward in the running direction. In this case, in order to stop at the overhead buffer 28, the overhead travelling carriage 14 may be stopped at a position forward away from the stop position for the load port 26 by a predetermined distance; the stop position is determined on the basis of the dogs 75, 76. Further, if the overhead buffer 28 is shifted forward (to the upstream side) in the running direction of the overhead travelling carriage 14 with respect to the load port 26, the forward dog 75 may be used to control the stoppage.

Figure 5:
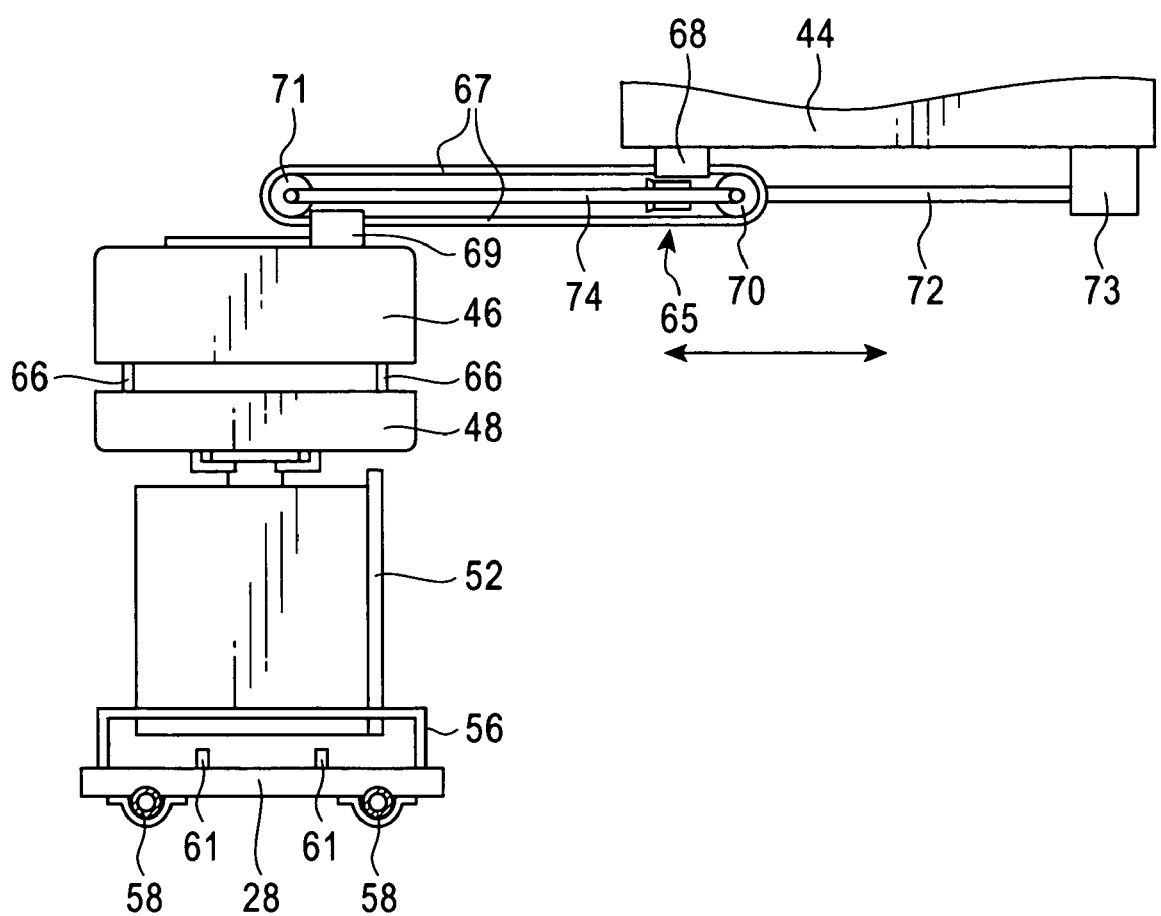
FIG. 5 is a diagram schematically showing a lateral moving mechanism of the overhead travelling carriage according to the embodiment.

FIG. 5 shows that the cassette 24 is being delivered to the overhead buffer 28. The platform 48 is supported by the elevation driving section 46 using a hanging member 66 such as a belt, a rope, or a band plate. The platform 48 is elevated and lowered by feeding and winding the hanging member 66. 67 is an endless belt such as a timing belt. The top of the loop of the belt 67 is fixed to the lateral feeding section 44 using a fixed portion 68. Further, the bottom of the loop of the belt 67 is fixed to the elevation driving section 46 using a fixed portion 69. 70, 71 are a pair of sprockets (gears). 72 is a ball screw, 73 is a ball screw driving mechanism, and 74 is a frame. When the ball screw 72 is rotated to move the frame 74 in the lateral direction of FIG. 5, the fixed portion 69 moves in the lateral direction in accordance with a stroke double that of the frame 74. Furthermore, the elevation driving section 46 has its lateral movement guided by the linear guides or the like. An arbitrary lateral feeding mechanism may be used for the elevation driving section 46.

Figure 6:
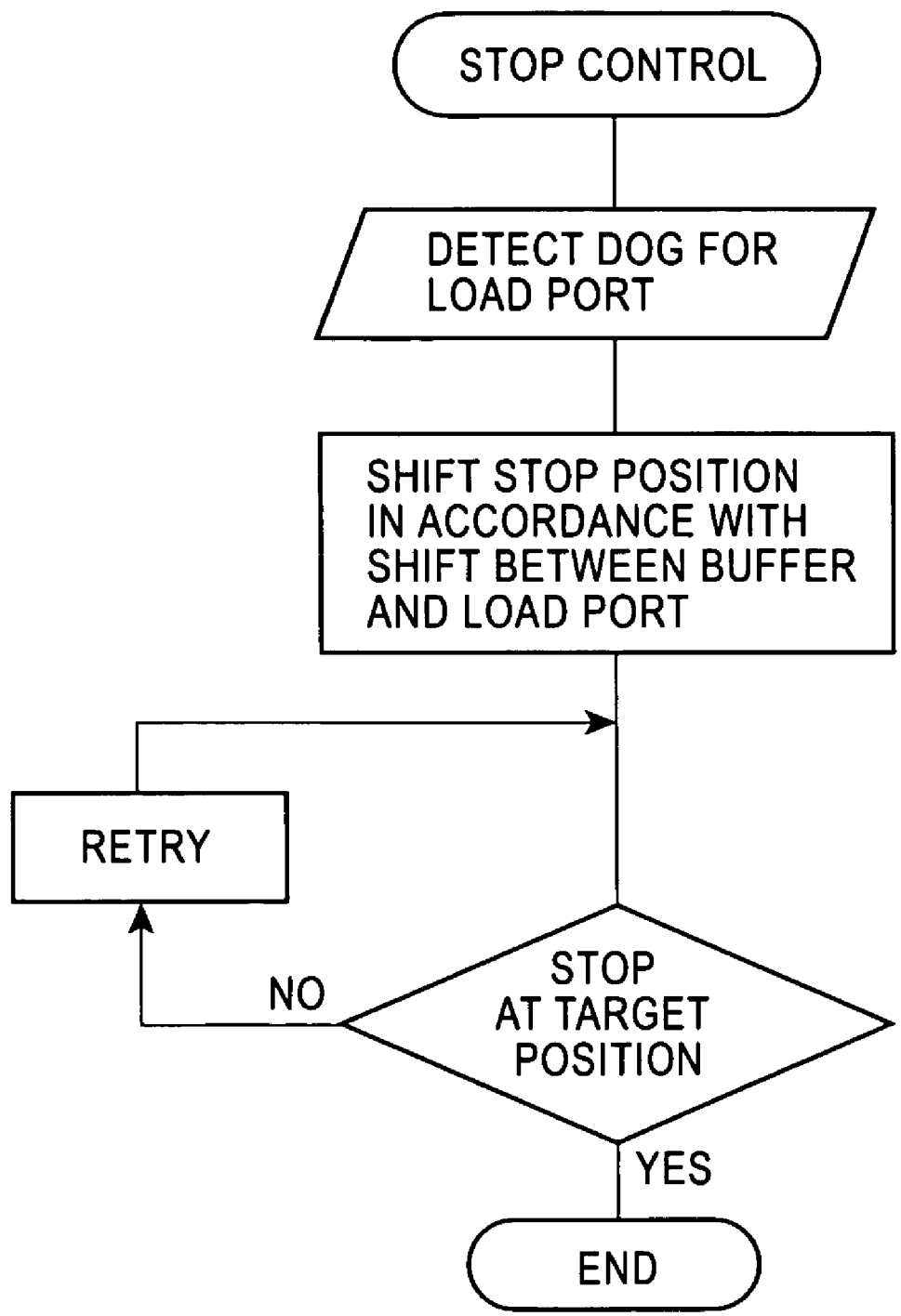
FIG. 6 is a flowchart showing the control of stoppage of the overhead travelling carriage at the overhead buffer according to the embodiment.
Figure 7:
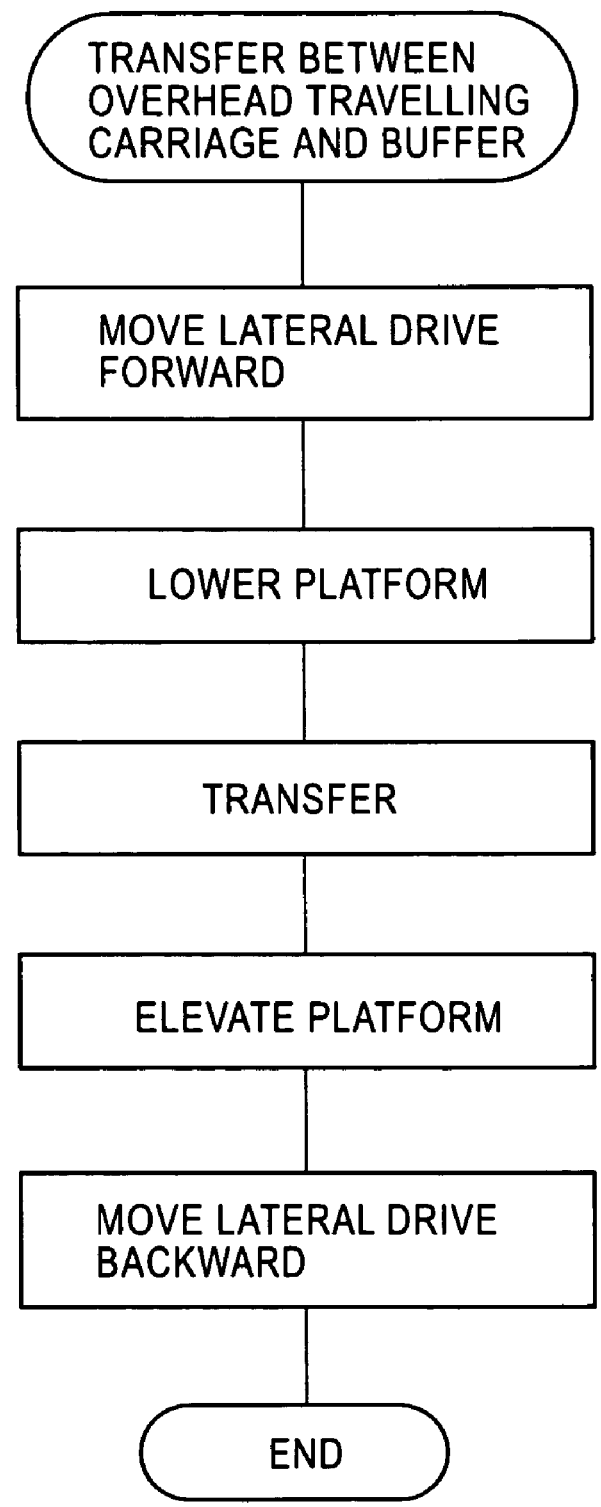
FIG. 7 is a flowchart showing the control of transfer of an article from the overhead travelling carriage to the overhead buffer according to the embodiment.
Figure 8:
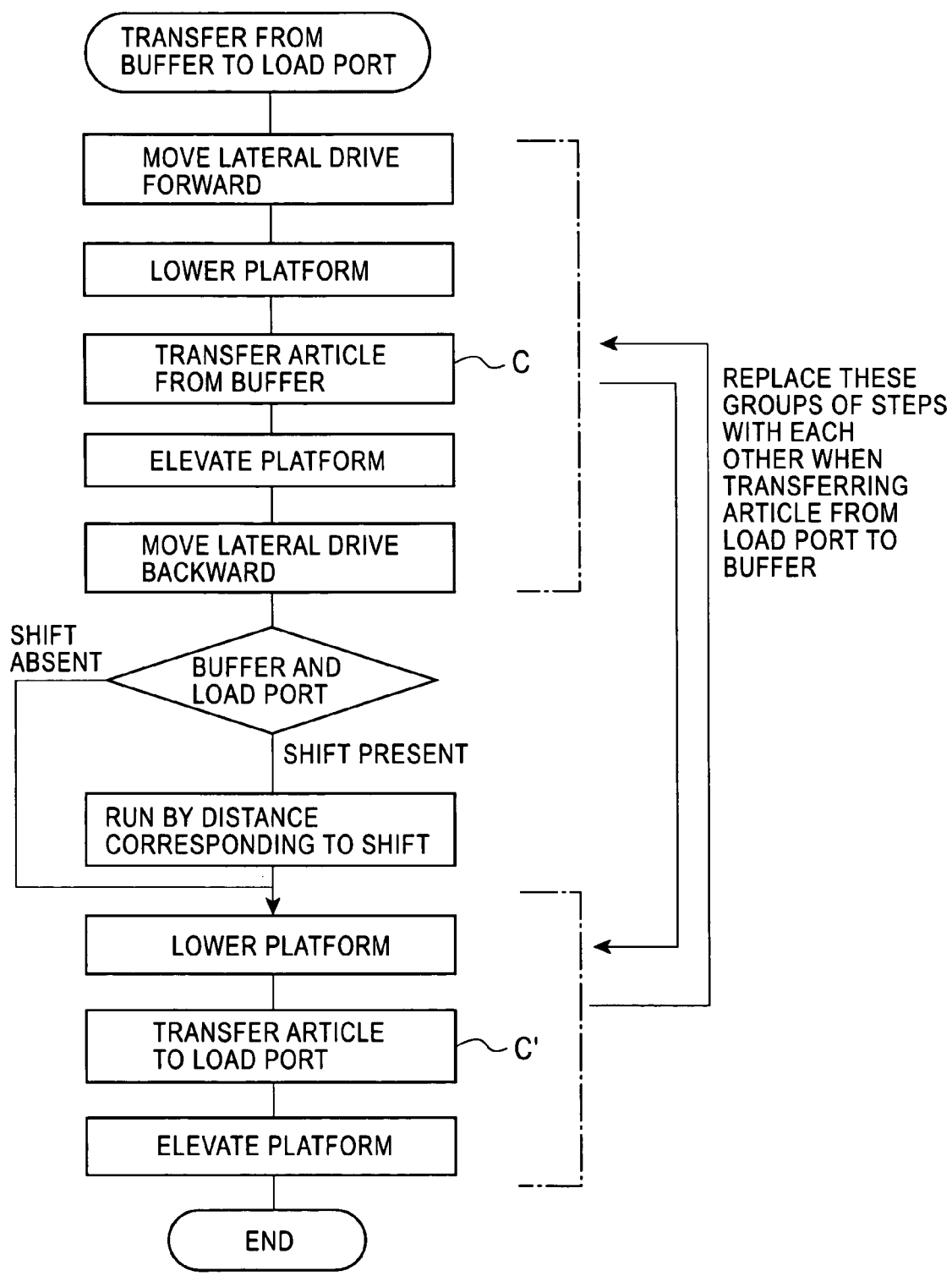
FIG. 8 is a flowchart showing the control of transfer of the article from the overhead buffer to a load port according to the embodiment.

FIGS. 6 to 8 show the control of stoppage of the overhead travelling carriage 14 and the delivery of the article to the overhead buffer 28 or load port. When the overhead travelling carriage 14 is stopped at the load port 26, the stoppage may be controlled in accordance with a dog detection signal. In the embodiment, the overhead buffer 28 is located at the same position as that of the load port 26. Accordingly, by performing the same control as that performed to stop the overhead travelling carriage 14 at the load port 26, it is possible to stop the overhead travelling carriage 14 at the correct position for the overhead buffer 28. If there is a shift between the overhead buffer 28 and the load port 26, the stop position may be changed depending on the shift.

To transfer the article between the overhead travelling carriage and the overhead buffer (FIG. 7), the elevation driving section is moved forward to the overhead buffer using the lateral drive of the lateral feeding section, and then the platform is lowered. While the lateral drive is being moved forward or backward, the bottom surface of the article is located slightly above the fall preventing fence and positioning pins of the overhead buffer. Consequently, the article does not interfere with the fall preventing fence or positioning pins. If the platform is lowered to unload the cassette on, for example, the overhead buffer, the article may be delivered by guiding it using the positioning pins. The positioning pins and the fall preventing fence prevent the cassette delivered to the overhead buffer from falling even if a strong force is exerted on the cassette during an earthquake or the like. Once the delivery is finished, the platform is elevated and the lateral drive is moved backward. On this occasion, the stroke used to lower or elevate the platform may be small, and only a short time is required for the delivery.

FIG. 8 shows the transfer of the article from the overhead buffer to the load port. In the embodiment, since the overhead buffer and the load port are located at the same position along the running direction of the overhead travelling carriage, the overhead travelling carriage need not run during the transfer. If the cassette is transferred from the overhead buffer to the load port, the lateral drive is moved forward to the overhead buffer and the platform is lowered. Then, the cassette is transferred from the overhead buffer to the platform. This step is called step (c). Then, the platform is elevated and the lateral drive is moved backward. If there is a shift between the overhead buffer and the load port along the running direction, the overhead travelling carriage is run by a distance corresponding to the shift. Since the load port is located immediately below the overhead travelling carriage, the platform is lowered and the cassette is delivered to the load port. This step is called step (c'). Then, the platform is elevated.

If the cassette is transferred from the load port to the overhead buffer, the latter three steps in FIG. 8 may be replaced with the former five steps. During the delivery of the cassette to the load port in step (c'), the cassette is transferred from the load port to the platform. Further, the transfer of the cassette from the overhead buffer to the platform in step (c) is replaced with the transfer of the cassette from the platform to the overhead buffer.

Figure 9:
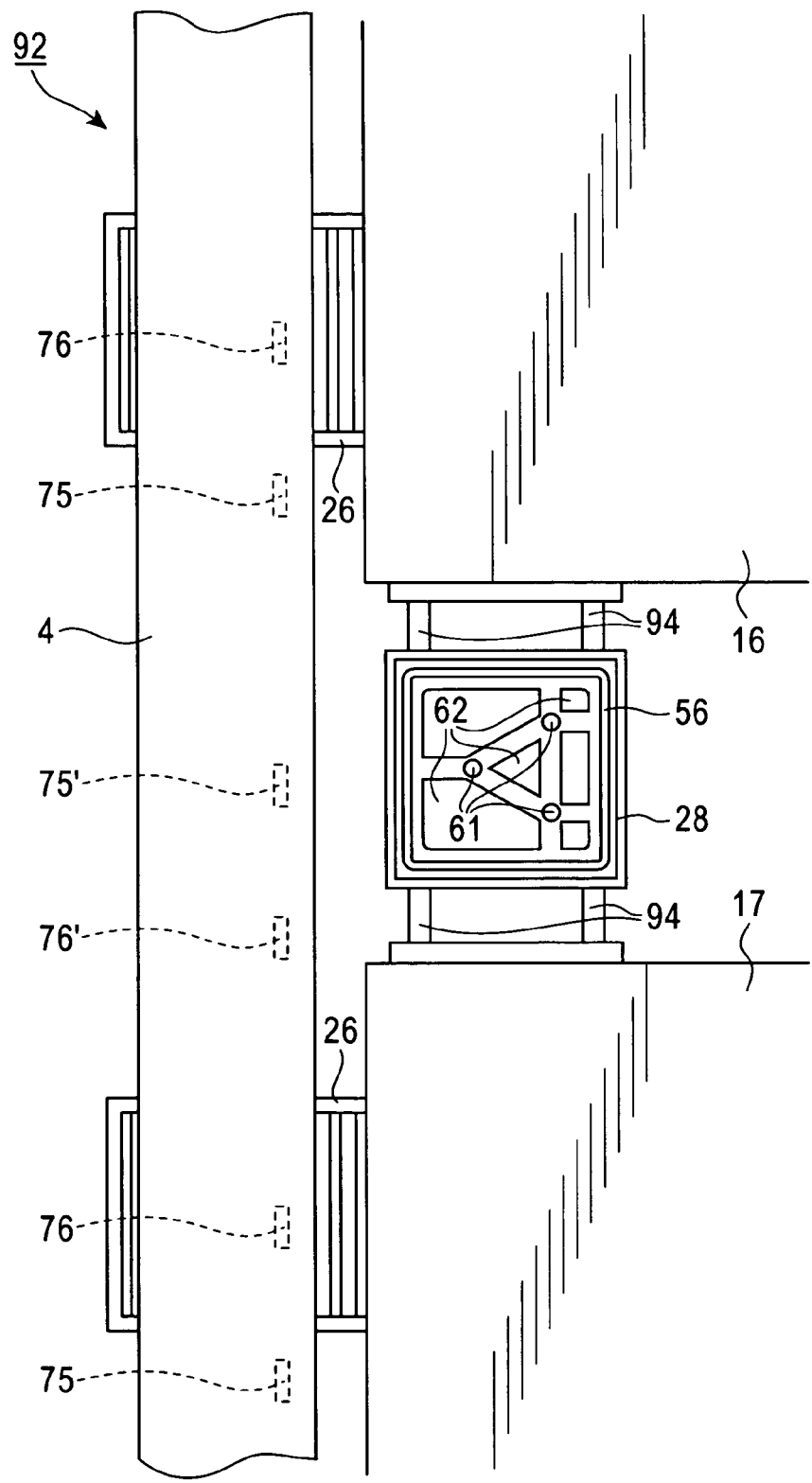
FIG. 9 is a plan view of an essential part of a variation, showing the running rail for the overhead travelling carriage and the overhead buffer.

FIG. 9 shows an overhead travelling carriage system 72 according to a variation. In FIG. 9, the same reference numerals as those in FIGS. 1 to 8 are the same components as those in FIGS. 1 to 8. The description of the embodiment shown in FIGS. 1 to 8 applies directly to the variation unless otherwise specified. However, the overhead travelling carriage can laterally feed the cassette to the overhead buffer located on either side of the running rail 4. In the variation shown in FIG. 9, the overhead buffer for one or more cassettes is provided in the gap between the processing device 16 and the processing device 17. The overhead buffer is supported by, for example, the processing devices 16, 17 using support members such as pipes. The overhead buffer 28 and the load port 26 have different stop positions at which the overhead travelling carriage stops. Accordingly, dogs 75', 76' are provided to control the stoppage of the overhead travelling carriage at the overhead buffer 28. The height of the overhead buffer 28 is similar to that shown in FIG. 3 and is such that the top of the fall preventing fence 56 is slightly lower than the bottom surface of the cassette being conveyed on the overhead travelling carriage.

The embodiment has the following effects.

(1) Articles such as cassettes can be conveyed directly between the different intra-bay routes via the inter-bay route from processing device to processing device. That is, if the destination load port is available, the article may be unloaded directly on the load port. If the destination load port is occupied, the article may be unloaded on the overhead buffer corresponding to the load port.

(2) This eliminates the need to provide stockers between the intra-bay route and the inter-bay route. Since it is unnecessary to divide one long-distance conveying operation into a plurality of parts, only a short time is required for the conveyance. Further, the transfer of the cassette between the overhead buffer and the load port may be carried out when a free overhead travelling carriage is running closer. Since the overhead buffer and the load port are located at the same position along the running direction, the overhead travelling carriage need not run during the transfer. This enables the cassette to be transferred in a short time simply by laterally feeding and elevating or lowering the platform.

(3) The load port can be prevented from being occupied by moving the article such as a cassette from the source load port to the opposite overhead buffer and temporarily storing the cassette on the overhead buffer. The order of conveyance can also be changed.

(4) Even if there is not a sufficient space to provide the overhead buffer between the load ports, an additional overhead buffer can be installed. As a result, the conveyance efficiency of the overhead travelling carriage system can be improved.

(5) The overhead buffer can be provided at a height such that it does not interfere with the operator. In particular, when the overhead buffer is slightly lower than the bottom surface of the article being conveyed on the overhead travelling carriage, a large space can be created below the overhead buffer. It is also possible to reduce the stroke required to elevate or lower the platform in transferring the article between the overhead buffer and the overhead travelling carriage.

(6) When the overhead buffer and the load port are arranged at the same position along the running direction of the overhead travelling carriage, the dogs or the like which are used to control the stoppage of the overhead travelling carriage at the load port can be used to the control the stoppage of the overhead travelling carriage. As a result, the does can be easily attached to the rail. This also eliminates the need to run the overhead travelling carriage when the article is transferred between the load port and the overload buffer or minimizes the distance that the overhead travelling carriage runs during this operation.

(7) The positioning pins provided on the overhead buffer allow the cassette to be guided when the cassette is unloaded on the overhead buffer. The positioning pins are also effective in preventing the cassette from falling. Further, the fall preventing fence provided on the overhead buffer makes it possible to reliably prevent the cassette from falling during an earthquake.

(8) The openings formed in the overhead buffer prevent the flow of clean air from being blocked.

(9) It is possible to visually easily check whether or not the overhead buffer contains a cassette by constructing the overhead buffer using a transparent material or forming openings in the overhead buffer.

The invention claimed is:

1. An overhead travelling carriage system, comprising:
a fixed running rail comprising a first intra-bay route, a second intra-bay route and an inter-bay route,
a plurality of processing devices disposed below said fixed running rail, each processing device having at least one load port,
an overhead travelling carriage running on said fixed running rail, and
a plurality of overhead buffers, each corresponding to one of said plurality of processing devices, provided on one side of said fixed running rail and disposed above a corresponding one of said at least one load port,
wherein said overhead travelling carriage includes a delivery means for delivering an article between said overhead travelling carriage and one of said overhead buffers, between said overhead travelling carriage and one of said load ports, or between one of said overhead buffers and one of said load ports,
wherein delivery between one of said overhead buffers and one of said load ports does not include a change in a gripping of said article,
wherein each of said plurality of overhead buffers is disposed on an opposite side of said fixed running rail, relative to said corresponding one of said plurality of processing devices,
wherein said overhead buffer is supported by at least one of said processing devices and a ceiling of a room, and
wherein each of the overhead buffers is placed at almost the same position as that of the corresponding load port in a running direction of the fixed running rail.

2. An overhead travelling carriage system according to claim 1, wherein said delivery means moves a platform between each of the load ports and the corresponding overhead buffer.

3. An overhead travelling carriage system, comprising:
a fixed running rail comprising a first intra-bay route, a second intra-bay route and an inter-bay route,
a plurality of processing devices disposed below said fixed running rail, each processing device having at least one load port,
an overhead travelling carriage running on said fixed running rail, and
a plurality of overhead buffers, each corresponding to one of said plurality of processing devices, provided on one side of said fixed running rail,
wherein said overhead travelling carriage includes a delivery means for delivering an article between said overhead travelling carriage and one of said overhead buffers, between said overhead travelling carriage and one of said load ports, or between one of said overhead buffers and one of said load ports,
wherein delivery between one of said overhead buffers and one of said load ports does not include a change in a gripping of said article, and
wherein said plurality of overhead buffers are disposed in a gap between two of said plurality of processing devices and are supported only by said two of said plurality of processing devices via support members.

4. An overhead travelling carriage system according to claim 3, wherein said delivery means moves a platform between each of the load ports and the corresponding overhead buffer.

5. An overhead travelling carriage system, comprising:
a fixed running rail comprising a first intra-bay route, a second intra-bay route and an inter-bay route,
a plurality of processing devices disposed below said fixed running rail, each processing device having at least one load port,
an overhead travelling carriage running on said fixed running rail, and
a plurality of overhead buffers, each corresponding to one of said plurality of processing devices, provided on one side of said fixed running rail,
wherein said overhead travelling carriage includes a delivery means for delivering an article between said overhead travelling carriage and one of said overhead buffers, between said overhead travelling carriage and one of said load ports, or between one of said overhead buffers and one of said load ports,
wherein delivery between one of said overhead buffers and one of said load ports does not include a change in a gripping of said article, wherein each of said plurality of overhead buffers is disposed on an opposite side of said fixed running rail, relative to said corresponding one of said plurality of processing devices, and wherein each of said plurality of processing devices are disposed outside a path of said fixed running rail in said intra-bay route, and each of said plurality of overhead buffers are entirely disposed inside a path of said fixed running rail in said intra-bay route.

6. An overhead travelling carriage system according to claim 5, wherein said delivery means moves a platform between each of the load ports and the corresponding overhead buffer.

7. An overhead travelling carriage system according to claim 6, wherein each of the overhead buffers is placed at almost the same position as that of the corresponding load port in a running direction of the fixed running rail.

8. An overhead travelling carriage system according to claim 6, wherein at least one of said plurality of overhead buffers is disposed at a position where the article held by said overhead travelling carriage can be transferred to and from said load port without driving said overhead travelling carriage in a running direction of the fixed rail.

9. An overhead travelling carriage system according to claim 1, wherein said fixed running rail is supported by said ceiling of said room.

10. An overhead travelling carriage system according to claim 1, wherein said plurality of overhead buffers each include a fall preventing mechanism, and wherein a difference in height between a top of said fall preventing mechanism and a bottom surface of said article while held by said overhead travelling carriage during running of said overhead travelling carriage is between 30 mm and 300 mm.

11. An overhead travelling carriage system according to claim 3, wherein said support members are pipes each attached to said overhead buffer and one of said two of said plurality of processing devices.

12. An overhead travelling carriage system according to claim 3, wherein said plurality of overhead buffers each include a fall preventing mechanism, and wherein a difference in height between a top of said fall preventing mechanism and a bottom surface of said article while held by said overhead travelling carriage during running of said overhead travelling carriage is between 30 mm and 300 mm.

* * * * *